US009986668B2

(12) United States Patent
Zadesky

(10) Patent No.: US 9,986,668 B2
(45) Date of Patent: May 29, 2018

(54) METAL RETAINING FEATURES FOR HANDHELD ELECTRONIC DEVICE CASING

(71) Applicant: Apple Inc., Cupertino, CA (US)

(72) Inventor: Stephen P. Zadesky, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days. days.

(21) Appl. No.: 14/559,472

(22) Filed: Dec. 3, 2014

(65) Prior Publication Data

US 2015/0085445 A1 Mar. 26, 2015

Related U.S. Application Data

(63) Continuation of application No. 13/340,407, filed on Dec. 29, 2011, now Pat. No. 8,912,438, which is a
(Continued)

(51) Int. Cl.
*H05K 9/00* (2006.01)
*H05K 5/00* (2006.01)
(Continued)

(52) U.S. Cl.
CPC ........... *H05K 9/0067* (2013.01); *C22C 45/00* (2013.01); *G06F 1/1626* (2013.01);
(Continued)

(58) Field of Classification Search
CPC .. H05K 9/0067; H05K 5/0013; H05K 5/0086; H05K 9/0049
(Continued)

(56) References Cited

U.S. PATENT DOCUMENTS 3,950,603 A 4/1976 Brefka
4,302,795 A * 11/1981 Johnson ................ G03B 15/03
362/16
(Continued)

FOREIGN PATENT DOCUMENTS

JP 04355410 * 12/1992

OTHER PUBLICATIONS

Liquid Metal Advocate, Telford, Mark; Nov. 20, 2007.*
(Continued)

*Primary Examiner* — Timothy Thompson
*Assistant Examiner* — Charles Pizzuto
(74) *Attorney, Agent, or Firm* — Brownstein Hyatt Farber Schreck, LLP

(57) ABSTRACT

This invention is directed to mechanical and electromagnetic shielding features of an electronic device case. An electronic device case is formed of two housings, each housing having integrated snaps, channels, or other retaining features used to secure the housings together. The housings additionally include integrated retaining features used to secure electronic components within the device case. The housings and retaining features are formed of amorphous metals or other materials with high elasticities. Because the retaining features necessary to assemble the case and secure the electronic components to the case form integral parts of the housings, no external retaining features are required to assemble the electronic device in the case.

20 Claims, 4 Drawing Sheets

Related U.S. Application Data continuation of application No. 12/123,728, filed on May 20, 2008, now Pat. No. 8,101,859.

(60) Provisional application No. 61/010,078, filed on Jan. 3, 2008.

(51) Int. Cl.
*G06F 1/16* (2006.01)
*C22C 45/00* (2006.01)
*H04M 1/02* (2006.01)

(52) U.S. Cl.
CPC ......... *G06F 1/1656* (2013.01); *H05K 5/0013* (2013.01); *H05K 5/0086* (2013.01); *H05K 9/0049* (2013.01); *H04M 1/0252* (2013.01); *Y10T 29/49117* (2015.01); *Y10T 29/49826* (2015.01); *Y10T 29/49876* (2015.01)

(58) Field of Classification Search
USPC ........................................ 361/679.56; 29/825
See application file for complete search history.

(56) References Cited

U.S. PATENT DOCUMENTS

| | | | |
|---|---|---|---|
| 4,766,519 A | 8/1988 | Heiland | |
| 4,912,602 A * | 3/1990 | Zurek | H04B 1/3833 361/752 |
| 5,120,175 A | 6/1992 | Arbegast et al. | |
| 5,383,098 A | 1/1995 | Ma et al. | |
| 5,515,988 A | 5/1996 | Oda | |
| 5,531,345 A | 7/1996 | Nakamura et al. | |
| 5,536,917 A | 7/1996 | Suppelsa et al. | |
| 5,613,237 A | 3/1997 | Bent et al. | |
| 5,731,963 A | 3/1998 | Heiss et al. | |
| 6,362,421 B1 | 3/2002 | Layton, Jr. | |
| 6,927,335 B2 | 8/2005 | Lim et al. | |
| 6,992,248 B1 | 1/2006 | Dunbar et al. | |
| 7,253,359 B2 | 8/2007 | Chen et al. | |
| 7,316,271 B2 | 1/2008 | Moyes | |
| 7,429,700 B2 | 9/2008 | Kanamaru et al. | |
| 7,642,452 B2 | 1/2010 | Kanazawa et al. | |
| 7,712,621 B2 | 5/2010 | Cho et al. | |
| 7,735,669 B2 | 6/2010 | Liang | |
| 7,923,647 B2 | 4/2011 | Murakami et al. | |
| 7,933,123 B2 * | 4/2011 | Wang | G06F 1/1626 361/679.55 |
| 8,830,665 B2 | 9/2014 | Lynch et al. | |
| 8,837,129 B2 | 9/2014 | Fu | |
| 2005/0150796 A1 * | 7/2005 | Wong | A45C 11/18 206/320 |
| 2008/0155839 A1 | 7/2008 | Anderson | |
| 2012/0104287 A1 | 5/2012 | Derks et al. | |

OTHER PUBLICATIONS

Author Unknown, "The Third Revolution in Material Technology. (The Way Ahead). (Liquidmetal Technologies, Liquidmetal, Amorphous Alloy)," Advanced Materials & Processes, 3 pages, Jun. 1, 2003.

Fenske, Sean, "Amorphous Alloy Casts Strength, Hardness Into Thin Wall Casing. (Metals)" Medical Design Technology, 2 pages, Dec. 1, 2002.

* cited by examiner

METAL RETAINING FEATURES FOR HANDHELD ELECTRONIC DEVICE CASING

CROSS-REFERENCE TO RELATED APPLICATIONS

This application is a continuation patent application of U.S. patent application Ser. No. 13/340,407, filed Dec. 29, 2011 and titled "Metal Retaining Features for Handheld Electronic Device Casing," which is a continuation patent application of U.S. patent application Ser. No. 12/123,728, filed May 20, 2008 and titled "Metal Retaining Features for Handheld Electronic Device Casing," which is a nonprovisional patent application of and claims the benefit to U.S. Provisional Patent Application No. 61/010,078, filed Jan. 3, 2008 and titled "Metal Retaining Features for Handheld Electronic Device Casing," the disclosures of which are hereby incorporated herein by reference in their entireties.

BACKGROUND OF THE INVENTION

This invention is directed to mechanical and electromagnetic shielding features of an electronic device case.

SUMMARY OF THE INVENTION

An electronic device case is provided. In some embodiments, the case includes a first housing having a retaining feature extending from it. The retaining feature forms an integral part of the first housing, and is formed of an elastic material. The case further includes a second housing having an inner surface, the inner surface having a channel formed on it along an edge of the second housing. The retaining feature engages the channel when the electronic case is assembled, and securely couples the first and second housings together.

In other embodiments, the electronic device case includes a housing having an inner surface and having a retaining feature extending from the inner surface. The retaining feature forms an integral part of the housing and is formed of an elastic material. The retaining feature engages a component of the electronic device and elastically couples the component to the housing.

A method for constructing an electronic device case is also provided. In some embodiments, the method includes producing a first housing using a single production step. The first housing is produced such that the housing has a retaining feature that is formed as an integral part of the housing, and that extends from an edge of the housing. The retaining feature is formed of an elastic material. The method further includes producing a second housing using a single production step, the second housing being produced such that it has a channel formed along an edge of an inner surface of the housing. The channel is formed such that the retaining feature engages the channel when the electronic case is assembled, and such that the first and second housings are securely coupled together when the retaining feature engages the channel.

BRIEF DESCRIPTION OF THE DRAWINGS

The above and other features of the present invention, its nature and various advantages will be more apparent upon consideration of the following detailed description, taken in conjunction with the accompanying drawings, and in which.

DETAILED DESCRIPTION

An electronic device case is provided having mechanical and material design features enabling the device and device case to have a smaller form factor, reduced weight, and simplified device and assembly characteristics as compared to prevailing device cases. The mechanical and material design features described herein may also enable other advantageous electronic device case features.

Figure 1A:
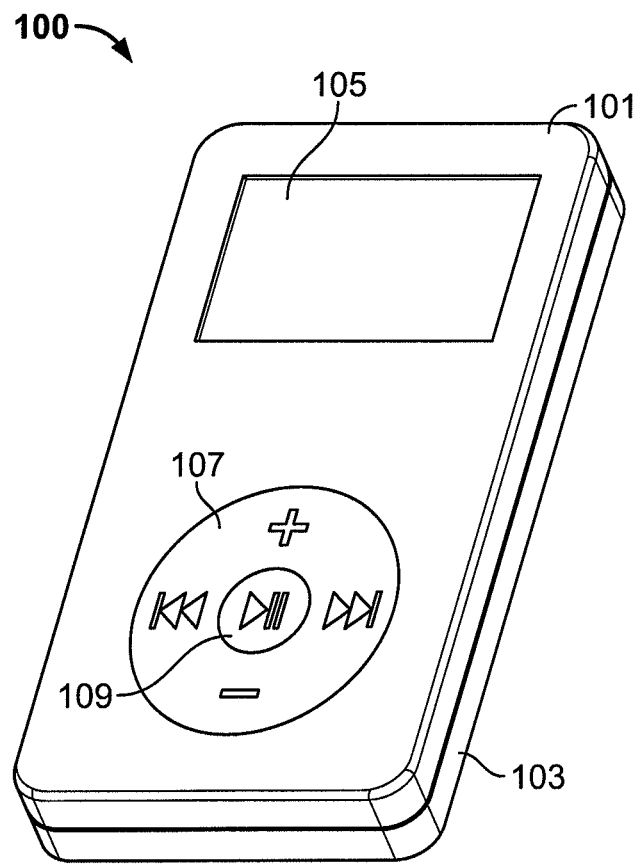
FIG. 1A is a front view of an illustrative electronic device case in accordance with one embodiment of the invention.

FIG. 1A is a front view of an illustrative electronic device case 100 in accordance with one embodiment of the invention. Case 100 may include screen 105, input mechanism 107/109, and upper housing 101. Upper housing 101 functions as a bezel. Screen 105 may be any suitable screen or display for providing content to a user of the electronic device. For example, screen 105 may include a glass, plastic, composite, combinations thereof, or any other suitable material surface by which content may be displayed. In some embodiments, screen 105 may include an input mechanism for providing input to the electronic device (e.g., a touch screen). In other embodiments, screen 105 may be eliminated, or may be replaced by one or more diodes, visual indicators, or other user feedback devices.

Input mechanism 107/109 may include any suitable mechanism for providing inputs to the electronic device. For example, the input mechanism may include a wheel 107 and one or more buttons 109 (e.g., a click-wheel). In some embodiments, input mechanisms may be incorporated in screen 105 as a touch-screen input mechanism, such as that described in U.S. Pat. No. 6,323,846, which is incorporated by reference herein in its entirety. The user interface may emulate a rotary phone or a multi-button keypad, which may be implemented on a touch screen or the combination of a click wheel or other user input device and a screen. A more detailed discussion of such a rotary phone interface may be found, for example, in U.S. patent application Ser. No. 11/591,752, filed Nov. 1, 2006, entitled "Touch Pad with Symbols based on Mode," which is incorporated by reference herein in its entirety.

Figure 1B:
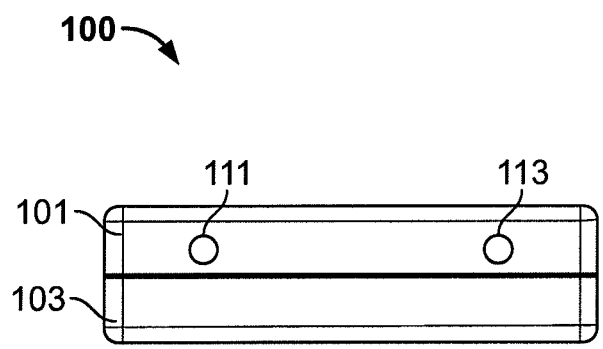
FIG. 1B is a top view of the electronic device case of FIG. 1A in accordance with one embodiment of the invention.

Upper housing 101 may form the upper outer surface of case 100. Housing 101 may include apertures for receiving screen 105 and input mechanism 107/109, and may include features on the inner surface of housing 101 for coupling each of screen 105 and input mechanism 107/109 in housing 101. In some embodiments, housing 101 may include additional apertures for accessing connectors and input mechanisms. FIG. 1B is a top view of the electronic device case of FIG. 1A in accordance with one embodiment of the invention. As shown in FIG. 1B, housing 101 may include apertures for accessing connector 111 and jack plug 113. Case 100 may include lower housing 103, which may be coupled to housing 101 to form the outer surface of case 100.

One or both of housing 101 and housing 103 may be constructed from any suitable material, and using any suitable approach. For example, housing 101 and housing 103 may be formed from metal in order to protect the electronic and/or other devices located inside case 100 from electromagnetic interference (EMI) and electro-static discharge (ESD). Alternatively, one, both, or a portion of housing 101 and housing 103 may be constructed of a non-metallic material to enable the electronic device located inside case 100 to emit or receive electro-magnetic signals (e.g., radio, WIFI, GSM, or other signals). Housing 101 and housing 103 may be constructed from a material selected for its weight, strength, shielding properties, compliance or elasticity, durability, cost, aesthetics, or any suitable attribute or combination of attributes.

Figure 2:
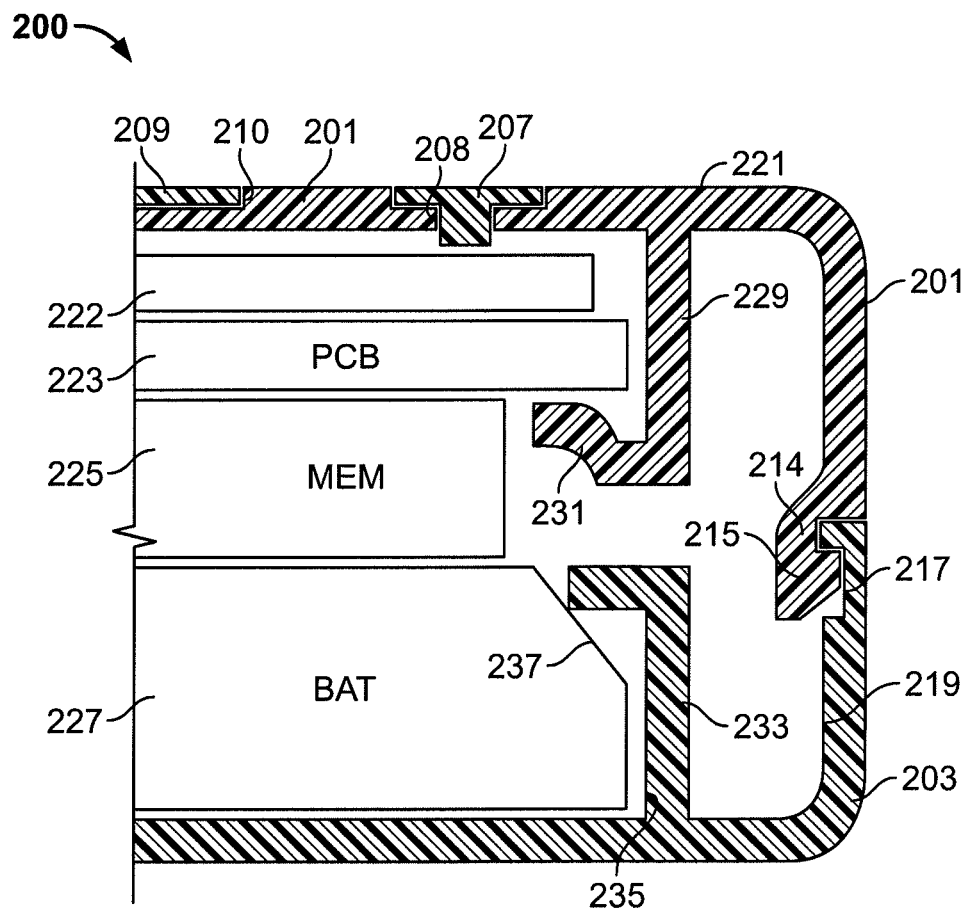
FIG. 2 is a cross-sectional view of an illustrative assembled case in accordance with one embodiment of the invention.

FIG. 2 is a cross-sectional view of a portion of an illustrative assembled case 200 in accordance with one embodiment of the invention. Case 200 includes upper housing 201 which is coupled to lower housing 203 to form the outer surface 221 of case 200. Upper housing 201 and lower housing 203 are coupled to each other by retaining features 214/215 and 217.

Retaining feature 214/215 extends outwards from the outer edge of housing 201, and includes flange 214 and snap 215. In some embodiments, retaining feature 214/215 may extend from housing 201 in a direction substantially perpendicular to (or orthogonal or transverse to) a substantially planar portion of housing 201. In the embodiment shown in FIG. 2, for example, retaining feature 214/215 extends from housing 201 in a direction substantially perpendicular to (or transverse to) the substantially planar portion of housing 201 on which indentation 210 and perforation 208 are formed. In other embodiments, retaining feature 214/215 may extend along or parallel to an outer wall of housing 201, effectively extending the length of the outer wall. In the embodiment shown in FIG. 2, for example, retaining feature 214/215 extends along the outer wall of housing 201 (the outer wall being depicted as the vertical portion of housing 201 that is substantially perpendicular to the planar portion of the housing).

Retaining feature 214/215 can come into contact with inner surface 219 of housing 203 when case 200 is assembled. In a preferred embodiment, flange 214 and snap 215 form integral parts of housing 201 (i.e., they are formed as a unit) and are formed as part of the same manufacturing process as housing 201. The physical contact between flange 214 and housing 203 may create a seal (e.g., an air-tight seal, water-proof seal, electromagnetic barrier) at the interface between the flange and housing, ensuring that particulate matter (e.g., dust, water, dirt) and electromagnetic waves (e.g., EMI, ESD) cannot penetrate assembled case 200. In some embodiments, a sealing gasket such as a rubber gasket or o-ring may be placed between flange 214 and housing 203 to create a seal at the interface(s) between the gasket, flange 214, and housing 203.

Figure 3A:
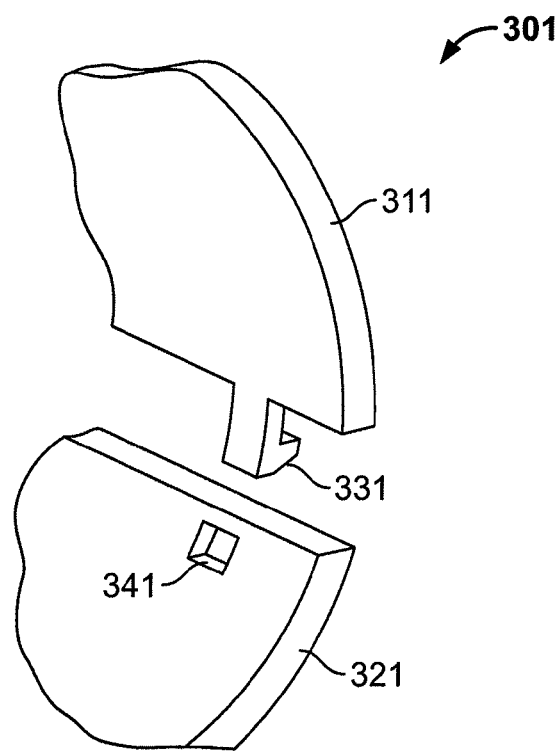
FIGS. 3A-3D are oblique views of four illustrative retaining feature assemblies in accordance with various embodiments of the invention.

Snap 215 may extend either from flange 214 (as shown) or directly from housing 201 in embodiments in which flange 214 is absent (see, e.g., FIG. 3A showing snap 331 extending outwards from housing 311). Snap 215 may be designed to engage retaining feature 217. Retaining feature 217 may take the form of, for example, an indentation, channel, or other receiving feature formed in inner surface 219 of housing 203 (as shown). In a preferred embodiment, snap 215 may form an integral part of housing 201 and be formed of the same material and as part of the same manufacturing process as housing 201. Retaining feature 217 may similarly form an integral part of housing 203 and be formed of the same material and as part of the same manufacturing process as housing 203. Snap 215 and feature 217 may be formed from any suitable material that allows snap 215 and/or feature 217 to be elastically deformed when housing 201 is inserted into housing 203. In particular, snap 215 and feature 217 may be formed of an elastic material, i.e. a material with high elasticity which allows snap 215 and/or feature 217 to bend or deform without yielding when a force is applied to them, and to regain their shapes once the force is removed. For example, snap 215 and feature 217 may be formed of an amorphous metal alloy having a high elasticity and an ability to bend without yielding (e.g., liquidmetal, vitreloy, metallic glasses). In embodiments in which both snap 215 and feature 217 are made of elastic materials, snap 215 and feature 217 may be deformed by substantially the same amount (measured as, e.g., the same distance from the snap's or the feature's rest position, or the same distance from their positions when the housings are coupled) when housing 201 is inserted into housing 203. In some embodiments, snap 215 and/or feature 217 may remain deformed while housings 201 and 203 are secured to each other. In other embodiments, snap 215 and/or feature 217 may only be deformed while housing 201 is being inserted into housing 203.

Retaining features 214/215 and 217 may take various forms including, for example, the form of snaps (as shown at 215), flanges (as shown at 214) hooks, tabs, springs, stubs, perforations, indentations (as shown at 217). Various combinations of retaining or receiving features formed on upper and lower housings 201 and 203 may be used to secure the housings to each other. Retaining features may be designed to permanently secure housings 201 and 203 together, or to temporarily or reversibly secure the housings together. While case 200 is illustratively shown as being formed of two housings 201 and 203, case 200 may be formed of greater numbers of housings secured to each other by any number or combinations of retaining features. Additional characteristics of retaining features that may be used in accordance with the invention are shown in FIGS. 3A-3D and described in the detailed description associated with those figures.

Electronic device case 200 can be used to secure the various electronic and other components of the electronic device housed by case 200. Components of the electronic device may be mounted on the surface of case 200, or may be housed inside of case 200. Input/output mechanisms 207/209 may be located on portions of outer surface 221 of case 200. Input/output mechanism 209 may be mounted in indentation 210 of the outer-surface 221 of housing 201. Input/output mechanism 207 may be mounted in perforation 208 traversing the wall of housing 201. Input/output mechanisms 207/209 may be, for example, a screen, touch-screen, diode, button, scroll-wheel, connector, jack plug, or any other appropriate input and/or output mechanism of the electronic device.

Other components of the electronic device, such as plate 222, circuit board 223, memory or hard-disk 225, battery 227, may be housed within case 200. One or more of the components housed in case 200 may be secured to one or both of upper housing 201 and lower housing 203. Components may be firmly or elastically secured to one or more of the housings.

Components may be mounted to or secured to housings 201 or 203 using any number of retaining mechanisms or features. Components may be mounted or secured using retaining features such as one or more shafts 229, springs 231, hooks 233, indentations 235, or other features extending from inner-surface 219 of case 200. Components may be secured by direct physical contact with a retaining feature, such as the contact between circuit board 223 and spring 231, or the contact between battery 227 and hook 233. Alternatively, components can be secured through their physical interactions with other components, such as the interaction between plate 222 and circuit board 223 and input/output mechanism 207. In some embodiments, the retaining features 229/233 used to secure components within case 200 may extend substantially orthogonally to (or perpendicularly, or transversely) the surface of the housing they extend from, or orthogonally to the portion of the surface they extend from. In case 200 shown in FIG. 2, for example, shaft 229 and hook 233 extend substantially perpendicularly to the surfaces of housings 201 and 203 they respectively extend from.

Retaining features designed to secure components within case 200 can form integral parts of the housings they extend from, and be formed as part of the same manufacturing process as those housings. For example in case 200, shaft 229 and spring 231 may form an integral part of housing 201 and be formed as part of the same manufacturing process as housing 201. Similarly, hook 233 may form an integral part of housing 203 and be formed as part of the same manufacturing process as housing 203. In preferred embodiments, the retaining features 229, 231, and 233 are formed of the same material as the housing they extend from. The retaining features may in particular be formed of materials with high elasticities, such as amorphous metals, in order for the retaining features to elastically deform when the components they secure are inserted into the housings.

Retaining features may be designed or shaped so as to elastically couple components to the case, such that components can move if external forces are applied to the components or to the case and can return to their original positions once the forces are removed. Such retaining features may be designed or shaped so as to be compliant and to deform in response to forces applied to the components they secure. For example, shaft 229 and spring 231 may be compliant and deform in response to forces being applied to circuit board 223. In the embodiment of FIG. 2, the compliance of shaft 229 and spring 231 may prevent plate 222 and circuit board 223 from deforming in response to forces applied to mechanism 207. The compliance of shaft 229 and spring 231 may additionally mechanically insulate plate 222, circuit board 223, and any other components coupled to them, from vibrations or other forces (e.g., bumps, drops, etc.) applied to housing 201 or case 200.

Retaining features may alternatively be designed so as not to be compliant. For example, battery 227 is secured to housing 203 by the non-compliant retaining indentation 235 in inner-surface 219 of the housing. Indentation 235 is formed by a localized thinning of the wall of housing 203 (e.g., a thinning of the housing wall from a thickness of approximately 0.6 mm to a thickness of approximately 0.3 mm). Indentation 235 may secure battery 227 by hindering lateral movement of the battery along inner surface 219 when the battery is engaged in the indentation. Indentation 235 may also serve to reduce the quantity of material used in manufacturing housing 203, reduce the weight of housing 203, increase the volume contained within housing 203 and case 200, and increase the number or size of components that can be secured within case 200.

Components of the electronic device may include retaining features designed to facilitate the securing of the components to housings 201 or 203. Components may have indentations, perforations, edges, tabs, or other features operative to engage or interact with retaining features of the housings to secure the components. For example, beveled edge 237 of battery 227 is designed such that the elastic pressure exerted by compliant hook 233 on beveled edge 237 keeps battery 227 securely coupled to housing 203. Hook 233 elastically deforms when battery 227 is inserted into housing 203, and exerts a constant elastic force on beveled edge 237 to elastically secure battery 227 to inner-surface 219 of indentation 235.

FIGS. 3A-3D are oblique views of four illustrative retaining feature assemblies 301-304 in accordance with various embodiments of the invention. Each retaining feature assembly 301-304 may be used to secure one of housings 311-314 to the corresponding housing 321-324.

FIG. 3A is an oblique view of illustrative retaining feature assembly 301 used to secure housing 311 to housing 321. Housing 311 includes a retaining feature, illustratively shown as snap 331, configured to engage retaining channel 341 of housing 321 in order to secure housings 311 and 321 together when the housings are assembled. A seal may be formed at the interface of housings 311 and 321 when snap 331 is engaged in channel 341. In a preferred embodiment, snap 331 forms an integral part of housing 311 and is formed of the same material and as part of the same manufacturing process as housing 311. Snap 331 may be formed from an elastic material that allows snap 331 to be elastically deformed when housing 311 is assembled to housing 321.

Figure 3B:
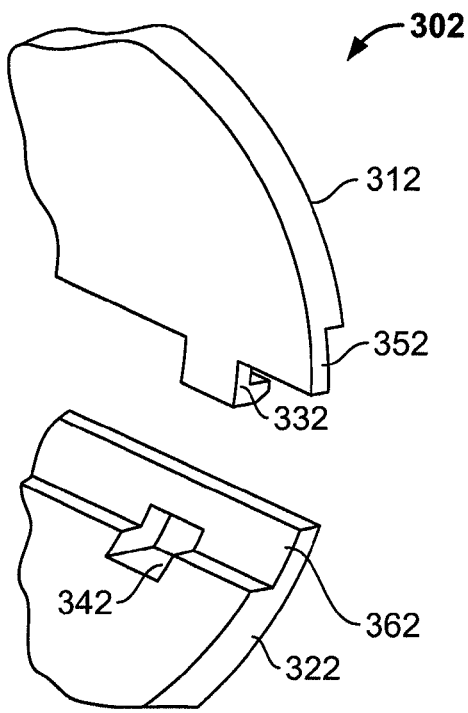

FIG. 3B is an oblique view of illustrative retaining feature assembly 302 used to secure housing 312 to housing 322. Assembly 302 is substantially similar to assembly 301, and similarly numbered elements of assembly 302 are formed and function in substantially similar ways as correspondingly numbered parts of assembly 301. Similarly to assembly 301, assembly 302 includes discrete snap 332 of housing 312 configured to engage into discrete indentation 342 of housing 322. Assembly 302 additionally includes a continuous flange 352 which extends from the outer edge of housing 312 and is configured to fit into a corresponding continuous indentation 362 of housing 322 when housings 312 and 322 are assembled. Flange 352 and indentation 362 may form a tight seal at their interface when housings 312 and 322 are assembled. The seal can ensure that neither particulate matter nor electromagnetic waves can penetrate through the assembly of housings 321 and 322.

Figure 3C:
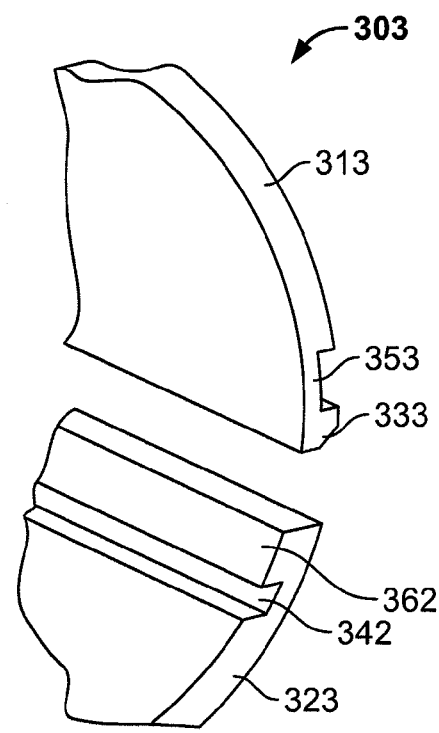

FIG. 3C is an oblique view of illustrative retaining feature assembly 303 used to secure housing 313 to housing 323. Assembly 303 is substantially similar to assembly 302, and similarly numbered elements of assembly 303 are formed and function in substantially similar ways as correspondingly numbered elements of assembly 302. Assembly 303 differs from assembly 302 in that housing 313 of assembly 303 includes a continuous snap 333 and a continuous flange 353 which extend substantially along the entire length of the outer edge of housing 313. Housing 323 has a continuous retaining indentation 342 which extends substantially along the entire length of housing 323 and is configured to engage with snap 333. When snap 333 engages indentation 342, housings 313 and 333 may be held securely to each other and a tight seal may be formed at the interface of flange 353 and indentation 362.

Figure 3D:
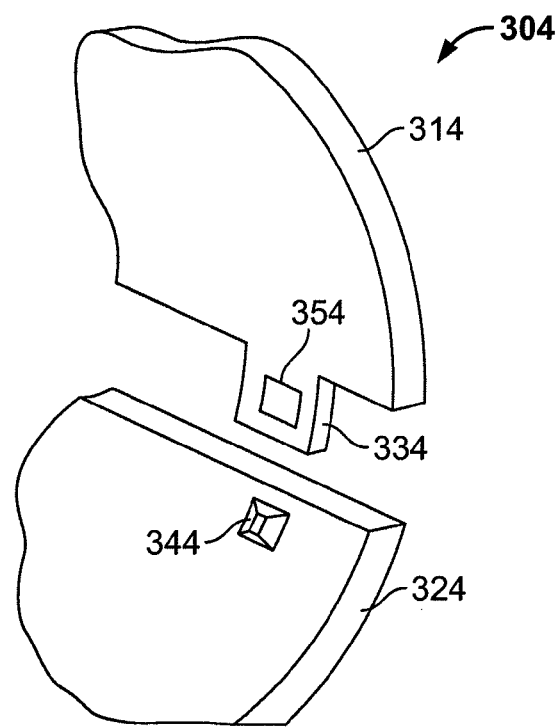

FIG. 3D is an oblique view of illustrative retaining feature assembly 304 used to secure housing 314 to housing 324. Assembly 304 is substantially similar to assembly 301, and similarly numbered elements of assembly 304 are formed and function in substantially similar ways as correspondingly numbered part of assembly 301. Assembly 304 differs from assembly 301 in that retaining snap 334 of assembly 304 includes a perforation 354, and housing 324 of assembly 304 includes a retaining protrusion 344. Snap 334 and protrusion 344 can be configured to secure housings 314 and 324 to each other. When protrusion 344 is engaged in perforation 354 of snap 334, housings 314 and 324 may be secured together. In some embodiments, retaining feature assembly 304 may include a flange (not shown in FIG. 3D) which extends from the outer edge of housing 314 and is configured to fit into a corresponding indentation (not shown in FIG. 3D) of housing 324 when housings 314 and 324 are assembled. The flange and indentation of assembly 304 may be substantially similar to, and function in a manner substantially similar to, flanges 352 and 353 and indentations 362 and 363 of FIGS. 3B and 3C. In a preferred embodiment, snap 334 forms an integral part of housing 314 and may be formed as part of the same manufacturing process as housing 314. Snap 334 may be formed from any suitable material that allows snap 334 to be elastically deformed when housing 314 is assembled to housing 324. For example, snap 334 may be formed of an amorphous metal alloy having a high elasticity and an ability to bend without yielding (e.g., liquidmetal).

The above described embodiments of the invention are presented for purposes of illustration and not of limitation, and the present invention is limited only by the claims which follow.

What is claimed is:

1. An electronic device comprising:
    a housing formed from an amorphous metal and having a retaining feature that is integrally formed within the housing, the retaining feature having a shaft portion extending into an internal volume of the housing and a spring portion extending from an end of the shaft portion; and
    an internal component disposed within the housing and coupled to the housing by the retaining feature, wherein the retaining feature is formed from the amorphous metal and has an ability to bend without yielding while the internal component is being assembled within the housing.

2. The electronic device of claim 1, wherein the shaft portion extends substantially perpendicularly from an internal surface of the housing.

3. The electronic device case of claim 1, wherein the retaining feature is configured to allow the internal component to displace upon application of an external force to the housing.

4. The electronic device case of claim 1, wherein the spring portion is compliant and mechanically insulates the internal component from vibrations applied to the housing.

5. The electronic device case of claim 1, wherein the spring portion forms a retaining surface configured to retain the component.

6. The electronic device case of claim 1, wherein the housing includes a second retaining feature that is integrally formed within the housing and extends inward from the internal surface of the housing.

7. The electronic device case of claim 6, wherein the first retaining feature and the second retaining feature both deform and bend without yielding when the internal component is being assembled within the housing.

8. The electronic device of claim 7, wherein the at least one of the retaining feature and the second retaining feature remains deformed when the internal component is assembled within the housing.

9. The electronic device case of claim 1, wherein the internal component includes a battery disposed relative to the internal surface of the housing.

10. The electronic device case of claim 1, wherein the internal component includes a printed circuit board disposed relative to the internal surface of the housing.

11. The electronic device case of claim 10, further comprising a second internal component disposed between the printed circuit board and the internal surface of the housing.

12. The electronic device case of claim 1, further comprising: an indentation in a surface of the housing, wherein the indentation engages the internal component to retain the internal component.

13. The electronic device case of claim 1, wherein the housing shields the internal component from electromagnetic interference and electro-static discharges.

14. An electronic device case comprising:
    a first housing comprising:
        a first retaining feature comprising an amorphous metal having an ability to bend without yielding while the first housing is being assembled to a second housing;
        an internal retaining feature that is integrally formed within the first housing and having a shaft portion extending into an interior of the first housing and a spring portion extending from an end of the shaft portion;
    the second housing having a second retaining feature configured to engage the first retaining feature and to couple the first and second housings together; and
    an internal component disposed within the electronic device case and coupled to the first housing by the internal retaining feature; wherein:
    the internal retaining feature is formed from the amorphous metal and has an ability to bend without yielding while the internal component is being assembled within the first housing.

15. The electronic device case of claim 14, wherein the first housing comprises a flange that extends from an outer edge of the first housing, and wherein the flange is operative to create a seal at the interface between the flange and the second housing when the first and second housings are assembled.

16. The electronic device of claim 14, wherein the coupling of the first and second housings form an outer surface of the electronic device case.

17. The electronic device of claim 14, wherein the first retaining feature is configured to engage the second retaining feature by fitting the first and second housings together, and wherein the first retaining feature and the second retaining feature extend substantially along the length of the first and second housings.

18. A method for constructing an electronic device, the method comprising:
    forming a housing from an amorphous metal, wherein a retaining feature is integrally formed within the housing and has a shaft portion extending into an internal volume of the housing and a spring portion extending from an end of the shaft portion; and
    engaging an internal component to the housing by deforming the retaining feature; wherein:
    the retaining feature bends without yielding while the internal component is being assembled within the housing.

19. The method of claim 18, wherein the shaft portion is formed from the amorphous material and bends without yielding when the internal component is being assembled within the housing.

20. The method of claim 18, further comprising engaging the internal component to a second retaining feature that is integrally formed within the housing, wherein the retaining feature and the second retaining feature both deform while the internal component is being assembled within the housing.

* * * * *